United States Patent
Rabiei et al.

(10) Patent No.: US 11,815,747 B1
(45) Date of Patent: Nov. 14, 2023

(54) ELECTRO-OPTIC ELECTRIC FIELD SENSOR AND METHOD OF FABRICATION

(71) Applicant: Partow Technologies LLC, Vista, CA (US)

(72) Inventors: Payam Rabiei, Vista, CA (US); Seyfollah Toroghi, Vista, CA (US)

(73) Assignee: Partow Technologies, LLC., Vista, CA (US)

( * ) Notice: Subject to any disclaimer, the term of this patent is extended or adjusted under 35 U.S.C. 154(b) by 680 days.

(21) Appl. No.: 17/013,614

(22) Filed: Sep. 6, 2020

Related U.S. Application Data

(60) Provisional application No. 62/897,253, filed on Sep. 6, 2019.

(51) Int. Cl.
  *G02F 1/225* (2006.01)
  *G01R 29/12* (2006.01)
  *C23F 1/02* (2006.01)
  *G02F 1/21* (2006.01)

(52) U.S. Cl.
  CPC ............ *G02F 1/225* (2013.01); *C23F 1/02* (2013.01); *G01R 29/12* (2013.01); *G02F 1/212* (2021.01); *G02F 2202/07* (2013.01); *G02F 2202/20* (2013.01)

(58) Field of Classification Search
  None
  See application file for complete search history.

(56) References Cited

U.S. PATENT DOCUMENTS 9,746,743 B1 * 8/2017 Rabiei ................ G02B 6/12009
2019/0346625 A1 * 11/2019 Cheng .................... G03F 7/2051

* cited by examiner

*Primary Examiner* — Roberts P Culbert
(74) *Attorney, Agent, or Firm* — Invent Capture, LLC.; Samuel S. Cho

(57) ABSTRACT

A novel method for producing a novel electro-optic electric-field sensor is disclosed. The resulting end product from this production method is a unique electro-optic electric-field sensor that includes thin film optical waveguides made from an electro-optic material on a low dielectric constant substrate. An optical circuit fabricated utilizing this production method may be a Mach-Zehnder interferometer or a micro-ring modulator. The low dielectric constant substrate allows the electric field to have high strength in the electro-optic thin film section, which in turn enables high sensitivity. In addition, for the Mach-Zehnder modulator sensor structure, phase matching is achieved between the RF or THz signal and the optical signal, resulting in an ultra-high-speed sensor for detection of Terahertz (THz) e-fields. An alternative design with a micro-ring electric-field sensor structure is also disclosed for high-spatial resolution electric-field sensing applications. The micro-ring configuration enables high sensitivity and spatial resolution.

11 Claims, 13 Drawing Sheets

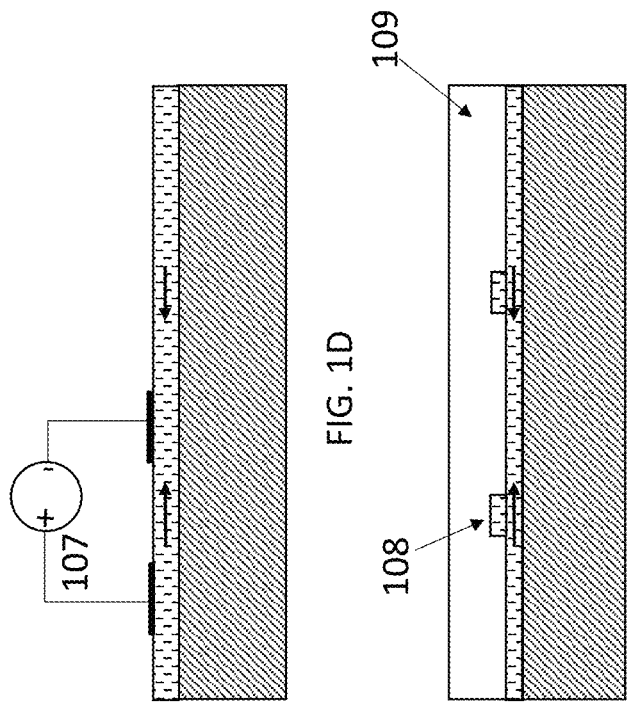
FIG. 1D
FIG. 1E
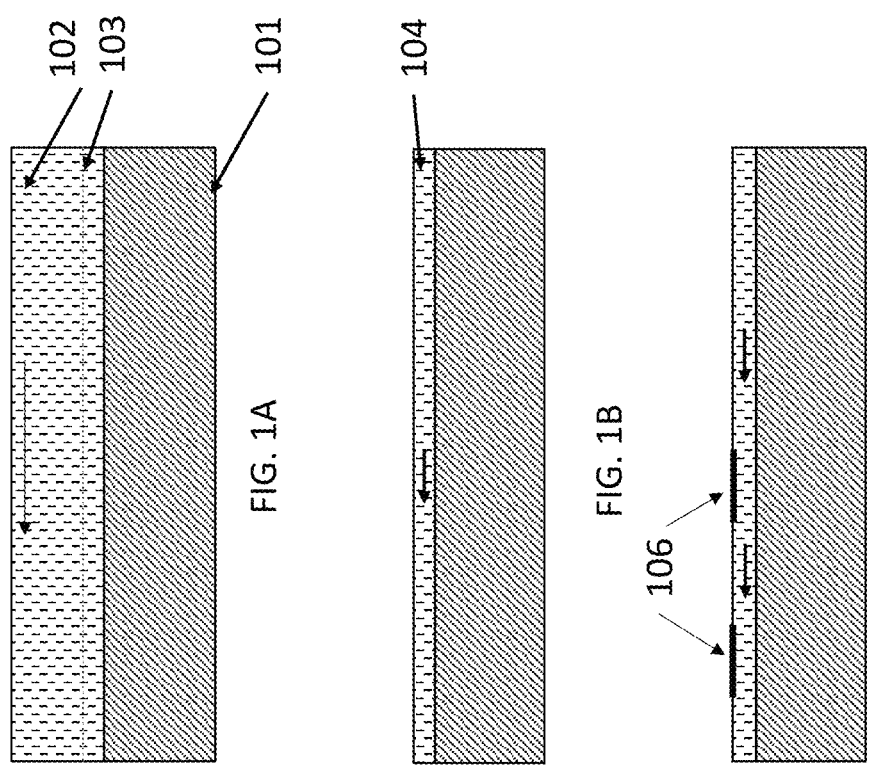
FIG. 1A
FIG. 1B
FIG. 1C

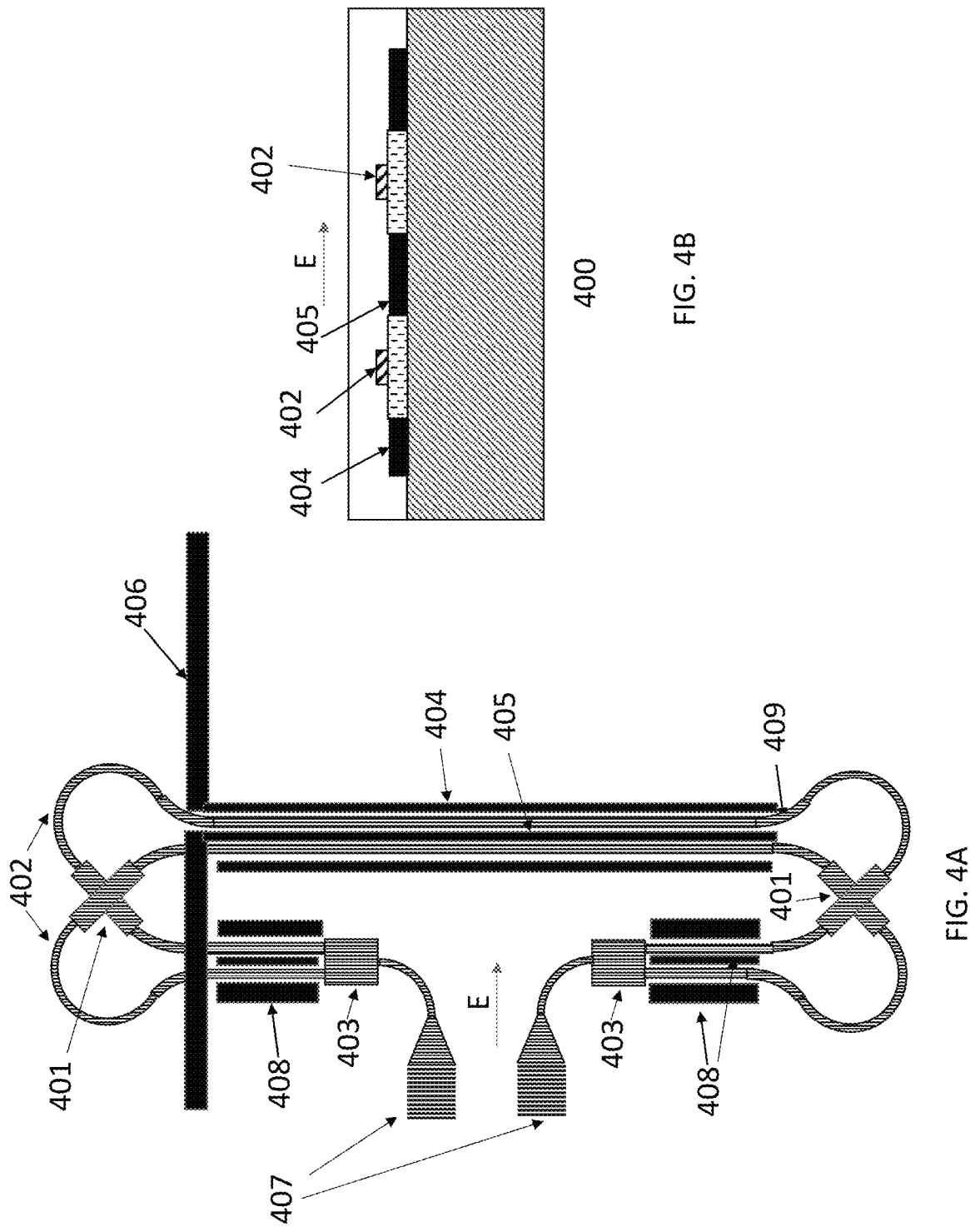

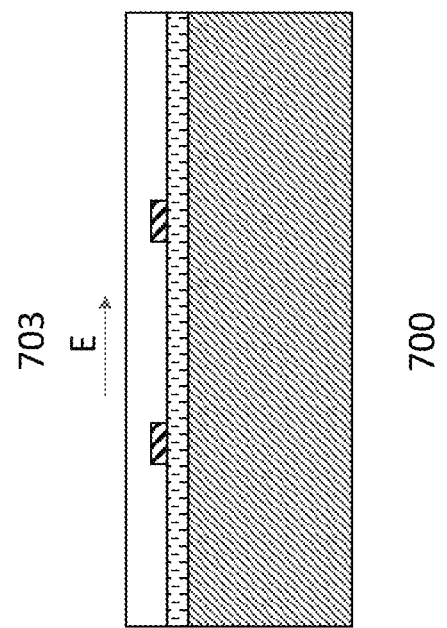
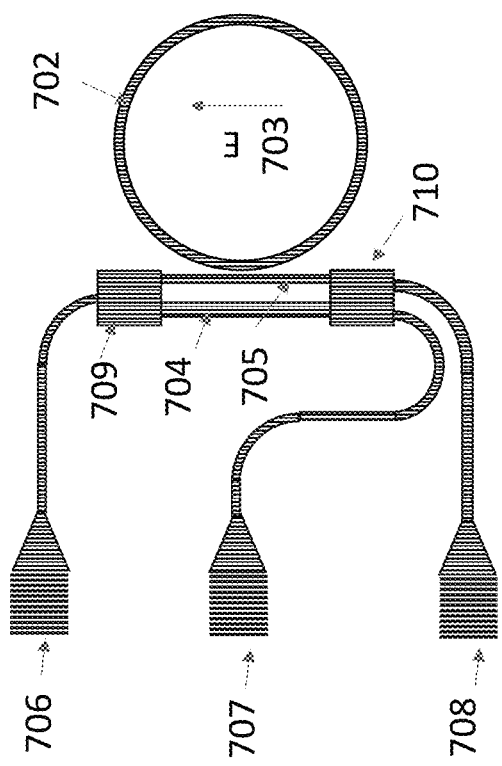
FIG. 7B
FIG. 7A

ELECTRO-OPTIC ELECTRIC FIELD SENSOR AND METHOD OF FABRICATION

FIELD OF THE INVENTION

The present invention generally relates to a method for producing compact electro-optical electric-field sensors. The present invention also relates to electro-optical electric-field sensors that are based on thin film lithium niobate or lithium tantalite waveguides. The present invention also relates to electric-field sensors that are made on quartz or other low dielectric constant substrate materials. Furthermore, the present invention relates to electric field sensors operating in a frequency range that varies between DC to several Terahertz (THZ). In addition, the present invention relates to electric-field sensors using Mach-Zehnder or micro-ring optical waveguide structures.

INCORPORATION BY REFERENCE

The present invention incorporates U.S. Ser. No. 16/258, 546 by reference. Furthermore, the present invention also incorporates U.S. Pat. No. 9,746,743 by reference. Importantly, both of these incorporated references have at least one common co-inventor to the present invention.

BACKGROUND OF THE INVENTION

Electric field sensors are widely utilized in a variety of applications in modern electronic devices. For example, electric field sensors are commonly utilized in plasma processing equipment for semiconductor device fabrication, accelerators for high energy physics, antenna characterization, other electromagnetic transmission systems, THz spectroscopy and any other applications where a DC or oscillatory electric field needs to be measured. Many of these applications require a sensor that minimally perturb the measurand electric field, have high sensitivity and is compact. Using electro-optical crystals, it is possible to sample and measure electric-field with an optical signal at high frequencies. Electro-optical devices can be used to sample the electric-field and convert the electric field to an optical signal to be measured using optical detectors.

An electric field sensor may include an electro-optic crystal where the phase of an optical signal is modulated in the electro-optic crystal, and also include a detection system where the modulated optical phase is detected. U.S. Pat. No. 5,267,336 shows a sensor utilized in electric field sensing in which an electro-optic Mach-Zehnder interferometer with two arms is used where two arms of the interferometer are poled in opposite directions. The sensor uses a Mach-Zehnder interferometer optical structure that has two optical coupler sections and two arms, where the optical phase of the signal is modulated by the external electric field measured in the arms of the sensor. A variety of other methods have been disclosed for measuring ultrafast electric fields. For example, a publication by Q. Wu. Et. al (Appl. Phys. Lett, 68, 2924, (1996)) shows an electro-optic method to measure ultrafast electric field.

Conventional sensor structures disclosed in such existing devices and methods have limitations in sensitivity, resolutions, and maximum detectable modulation speeds. Therefore, it may be desirable to provide a novel electric field sensor that can achieve a higher sensitivity and/or a higher modulation speed than a conventional sensor. In particular, it may be advantageous to devise a novel electric field sensor that improves the limitations of speed and sensitivity commonly exhibited by conventional sensors. Furthermore, it may also be desirable to provide novel electric field sensors with better spatial resolution. In particular, it may be advantageous to devise a novel electric field sensor that enables a higher spatial resolution for measuring electric fields. In addition, it may also be desirable to provide an optical system that can be used with the novel electric field sensor for measuring the electric field.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a novel method for producing an electro-optic electric-field sensor is disclosed. The electro-optic electric field sensor comprises thin film optical waveguides made from an electro-optic material on a low dielectric constant substrate. An optical circuit is fabricated on this waveguide using lithography and etching techniques to form the sensor. The optical circuit may be in the form of a Mach-Zehnder interferometer or a micro-ring modulator. The low dielectric constant substrate allows the electric field to have high strength in the electro-optic thin film section, which in turn enables high sensitivity. In addition, for Mach-Zehnder modulator sensor design, phase matching is achieved between the RF or THz signal and the optical signal. Therefore, an ultra-high-speed sensor can be achieved for detection of Terahertz (THz) e-fields. An alternative design using micro-ring modulators is introduced for high-spatial resolution electric-field sensing applications. The micro-ring electric-field sensor structure enables high sensitivity and high spatial resolution. An optical interrogation system is introduced to measure the sensor output.

BRIEF DESCRIPTION OF DRAWINGS

FIGS. 1A~1E show fabrication procedure steps for making the proposed sensor, wherein the fabrication procedure steps include thin film production, lithography, metallization, and etching to produce the proposed sensor head, in accordance with an embodiment of the invention.

FIG. 4A shows an optical circuit of a Mach-Zehnder based electric-field sensor that incorporates optical waveguides, grating coupler sections, waveguide crossing sections, an antenna electrode, and a DC bias electrode, and FIG. 4B shows a cross section of this optical circuit, in accordance with an embodiment of the invention.

FIG. 7A shows an optical circuit of a Micro-ring modulator-based electric field sensor coupled to a Mach-Zehnder interferometer section where higher linearity and sensitivity is achieved through detection of modulated phase of the optical signal, and FIG. 7B shows a cross section of this optical circuit, in accordance with an embodiment of the invention.

DETAILED DESCRIPTION

Figure 2B:
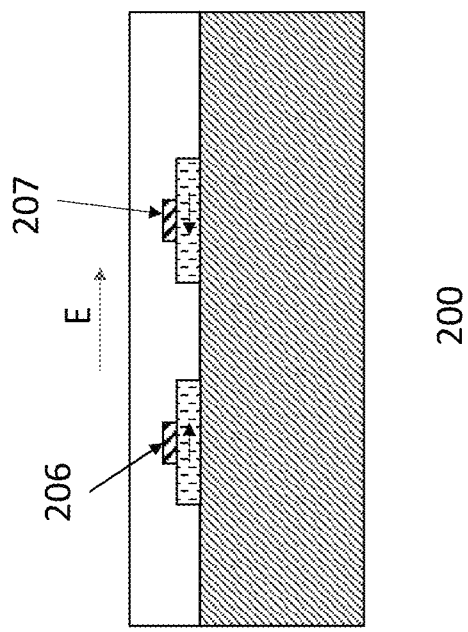
FIG. 2B shows a cross section of this optical circuit, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of procedures, logic blocks, processing, and/or other symbolic representations that directly or indirectly resemble one or more optical electric-field sensor production methods and spatially-compact optical modulators that exhibit high spatial and high sensitivity for electric-field sensing, in accordance with various embodiments of the invention. These apparatus and process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

In one embodiment of the invention, a novel method for making an electro-optic sensor for detection of electric field is introduced. The e-field sensor uses an electro-optic thin film material on a low dielectric constant substrate where the measurand electric field modulates an optical signal traveling in a waveguide structure, which is formed on the electro-optic thin film. In this embodiment, two type of sensor structures are disclosed. One structure is based on a Mach-Zehnder interferometer and is suitable for traveling wave modulation of optical signals sensor that can be used for extremely high-speed e-field signal measurements with time scale of a tenth of a pico-second and can be used for applications requiring very high-speed e-field sensor applications. For example, one application for this sensor is e-field measurement of electron bunches in high energy accelerators where electron-bunches are detected with a pulse width of one picosecond or smaller. Another application for this sensor is for detection and spectroscopy of THz signals, where THz signal modulates an optical signal in the novel sensor, wherein the optical signal is detected by optical methods. Furthermore, an e-field sensor based on micro-ring structures is introduced for measurement of e-field, where an electro-optic micro-ring structure is used.

Moreover, a detection scheme and a method for adjusting the bias point of sensor and an interrogation system for measuring the sensor output are disclosed. One method for adjusting the bias point of the sensor is by using a tunable laser and adjusting the bias point of the device by changing the tunable laser wavelength. In another method, an optical spectrometer is used for detection of the optically-modulated pulse for high speed applications. For Teraherz (THz) applications, the time domain THz spectroscopy or frequency domain THz spectroscopy systems can be utilized as the THz signal modulates an optical signal using disclosed E-field sensor.

FIGS. 1A-1E show device fabrication steps for producing an optical e-field sensor. As shown in FIG. 1A as a first step, the device is fabricated using an electro-optic material layer (102), which is bonded, transferred, and/or placed on a low dielectric constant substrate (101). In the preferred embodiment of the invention, the fabrication may start with an ion implantation (103) on top of the low dielectric constant substrate (101), or another method to form a thin film (104) of the electro-optic material layer (102), as shown in FIGS. 1A-1B. This step is followed by a wafer bonding of the electro-optic material layer (102) (e.g. lithium niobite) on the low dielectric constant substrate (101) (e.g. quartz).

Subsequently, as shown in FIG. 1B, the thin film (104) of the electro-optic material is formed on the low dielectric constant substrate (101). In the next step as shown in FIG. 1C, if a poling process is needed for the end product (e.g. an electro-optic electric field sensor) from these manufacturing steps, electrodes (106) are deposited and patterned on the thin film (104) of the electro-optic material, which enables alternations of the ferroelectric domains in Mach-Zehnder type sensor structures, as further described below.

For the purpose of describing the invention, a term herein referred to as "poling" is defined as a physical process that accommodates the change in distribution of the electrical charges in the electro-optic crystal. The electro-optic crystal that is used to produce the electric field sensor poses a polar structure. During the manufacturing of the crystal, the crystal is poled in a direction parallel to the substrate (e.g. 101 in FIG. 1) surface by applying a voltage and heating the bulk crystal, as shown by the arrow in FIG. 1A. In order to produce some of the electric field sensors in accordance with various embodiments of the present invention, opposite phase modulation in different sections of the electric field sensor is needed when an electric field is applied to the sensor. Because the sign of phase modulation is determined by the direction of the spontaneous polarization of the crystal, one needs to reverse the direction of spontaneous polarization of the crystal in certain regions of the crystal. A poling process is used to reverse the direction of spontaneous polarization of the crystal. The poling process is achieved by applying a high voltage (for example 100 Volt) over two electrodes that are placed in a close proximity (for example 5 micro-meter). This forms a high electric field of more than 20 kV/m, which is higher than the coercive field of the electro-optic crystal. Therefore, in this example, the crystal spontaneous polarization is reversed in between two electrode regions (e.g. 106 in FIG. 1C).

Continuing with the embodiment shown in FIG. 1C, the etching and subsequent poling process may be skipped for micro-ring-based structures, where alternate ferroelectric domains are not required. Alternatively, it may be desirable to utilize a metallic electrode for DC bias control or other functions in the device. If the poling process is needed, as shown in FIG. 1C, metallic electrode layers are deposited and patterned on the structure to create the electrodes (106). Subsequently, as shown in FIG. 1D, a high voltage source (107) is used to reverse the ferroelectric domain of selected mesa. Then, the electrodes (106) are removed by etching to achieve a structure with no metallic parts. Subsequently, as shown in FIG. 1E, a lithography and etching process is used to define the ridge waveguide structure (108), and a final top cladding layer (109) is deposited, which enables the device to be coupled to optical fibers using the grating coupler sections. The processing steps as shown and described in association with FIG. 1A~1E are device fabrication steps to produce the sensor device, in accordance with an embodiment of the invention.

Figure 2A:
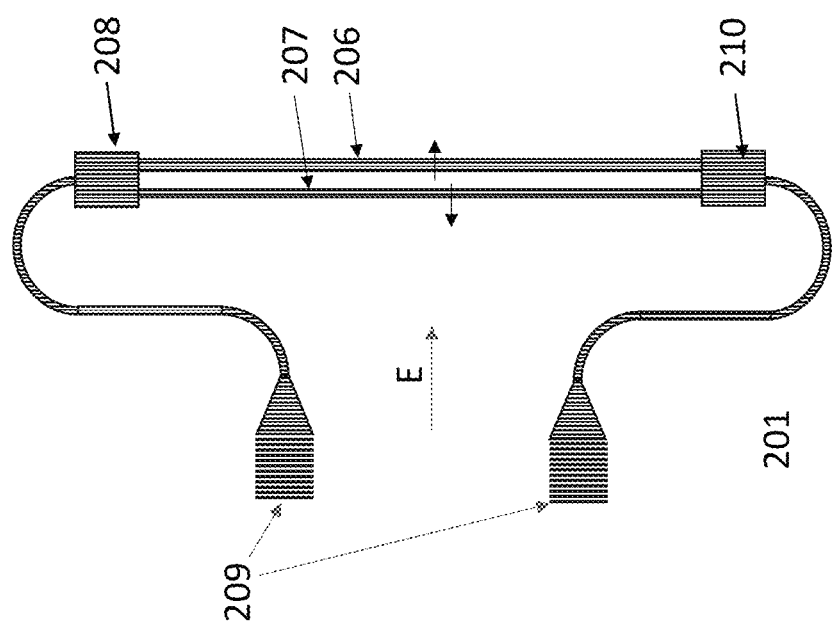
FIG. 2A shows an optical circuit of a Mach-Zehnder interferometer based electric-field sensor that includes optical waveguides and grating coupler sections while showing the direction of the spontaneous polarization of the electro-optic material.

FIG. 2A shows a photonic circuit device (201) and FIG. 2B shows the cross section (200) of this photonic circuit to make a e-field sensor, which utilizes the device fabrication process steps described previously. This photonic circuit device (201) is a Mach-Zehnder modulator where two arms of the device (206) and (207) are polled in opposite directions. When an electric field is applied to the device (201), the refractive index of one arm (i.e. 206) increases while the second arm (i.e. 207) decreases. This creates a phase difference for the light between the two arms of the device, which in turn results in destructive or constructive interference after they are combined using a multimode interference (MMI) combiner (e.g. 210). Therefore, in this embodiment, the optical signal is modulated using the alternating electric field signal, which can be detected using an optical signal detector. In this photonic circuit device (201), the light is coupled into and out of the device using two grating couplers (209). The grating couplers transform the optical mode from an optical fiber to the small mode of the waveguide of the device. The fibers are configured to be placed using a v-groove fiber array in proximity of the grating coupler sections and can be attached to the device using optical adhesives. The light from the input coupler is coupled to the device (201) and is split between two arms using a 1×2 power splitter (208), and the split light signals modulated in alternately-poled waveguide structure arms (206, 207). Then, the optical signals are combined using the MMI combiner (210), and the combined optical signal is sent through the second grating coupler to the output fiber.

Using the optical circuit (i.e. 201) explained above, when the sensor is placed inside an electric field, the refractive index of the two arms (206, 207) of Mach-Zehnder modulator device are phase-modulated by the applied electric field. However, since the two arms of the device are poled in opposite direction, the modulated phases have opposite signs in the two arms (206, 207) of the device (201). The phase-modulated signals in the two arms are (206, 207) then combined in the MMI combiner (210) and an intensity modulated signal is obtained.

Optical e-field sensors produced from fabrication steps involving bonding a thin film of electro-optic material such as lithium niobate to a low dielectric constant substrate such as quartz substrate have several advantageous. First, because the electro-optic material is bonded to a low dielectric constant substrate and since the thickness of the electro-optic material is much lower than the wavelength of the measured THz electric field, the effective electric field dielectric constant seen by the THz signal is equal to the quartz substrate dielectric constant. For electro-optic e-filed sensing the sensitivity of the sensor is proportional to $(r/\varepsilon)^2$ where r is the electro-optic coefficient ands is the dielectric constant of the substrate material. Hence, for bonded thin film electro-optic sensors on low dielectric constant substrates, the sensitivity is significantly higher since the effective dielectric constant is much lower than electro-optic material dielectric constant. This in turn ensures that the modulation of refractive index due to measurand electric field is strong, and hence the sensitivity of the proposed electro-optic sensor is very high. In addition, because the refractive index of the quartz at RF and THz frequency range is approximately equal to the refractive index of lithium niobate at optical frequency, it is possible to phase-match a traveling wave THz wave signal to the optical signal and achieve electro-optic modulation at THz frequencies. Therefore, the novel optical e-field sensor manufactured in accordance with the novel production steps has very high sensitivity and can also be used to measure high-frequency electric field signals, up to THz range, in a preferred embodiment.

The novel optical e-field sensor device from an embodiment of the present invention may operate at a wavelength of 1550 nm, or at other wavelengths. In the preferred embodiment of the invention, the width of waveguide structures can be between 200 nm to 2 micron, and thickness of waveguide structures may be 100 nm to 1 micron, depending on the operational wavelength. Furthermore, in the preferred embodiment, the length of the arms of Mach-Zehnder waveguide structure may be 100 microns to several millimeter, depending on the applications. The grating coupler sections may be a focusing type or a non-focusing type.

In order to use the novel optical e-field sensor device for sensing e-field of signals, the phase difference of the two arms need to be adjusted in order to bias the device. In a typical optical modulator, a DC voltage is used to adjust the phase difference between two arms of the device. However, for sensor applications, it may be desirable to exclude metallic layers because they may interfere with e-field measurements. Therefore, methods to adjust bias of the novel optical e-field sensor device, without using a DC voltage, may be advantageous and desirable. Moreover, applying a DC voltage may also be detrimental because it will cause continuous shifting of the bias point due to DC drift problems. Depending on the applications, the bias point needs to be adjusted to be at a minimum, at a maximum, or at quadrature points, as shown in FIG. 7A. This can be achieved by using slightly-different sizes of optical waveguides (e.g. 206, 207).

Figure 3B:
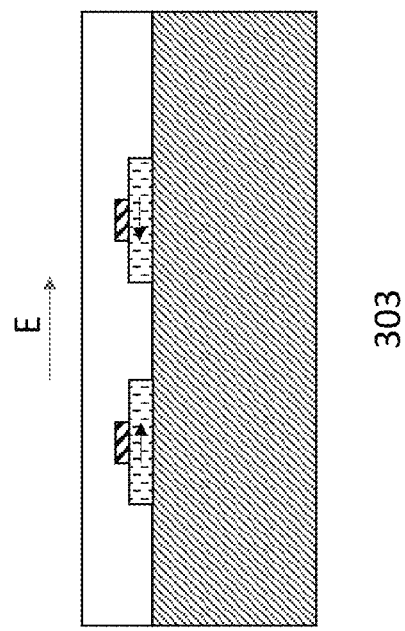
FIG. 3B shows a cross section of this optical circuit, in accordance with an embodiment of the invention.
Figure 3A:
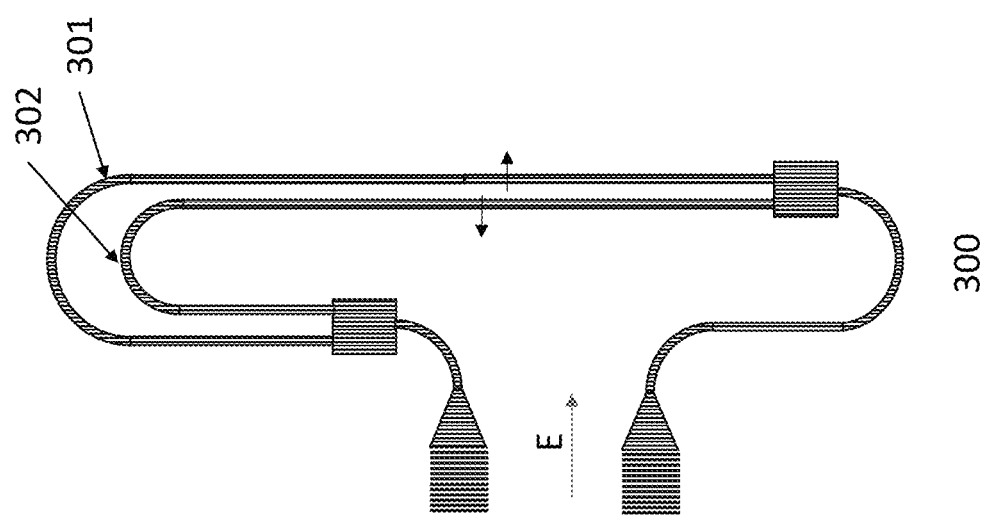
FIG. 3A shows an optical circuit of a Mach-Zehnder based electric-field sensor incorporating optical waveguides, grating coupler sections, and an additional waveguide section in the two arms of the interferometer for bias control while showing the direction of the spontaneous polarization of the electro-optic material.

One way to adjust bias point of the device is to use different width for one waveguide (e.g. 206) relative to the other waveguide (e.g. 207). By using different widths, the effective index of the optical mode is changed, which in turn enables adjustment of the bias point of modulator. Alternatively, it is possible to use two arms with different lengths for the two arms of a Mach-Zehnder modulator (300), as shown in FIG. 3A, and use a tunable laser where the wavelength of the laser is tuned. Because the embodiment of the invention as shown in FIG. 3A has two different lengths of the two arms (301, 302), by adjusting the laser wavelength, it is possible to adjust the bias point of the modulator in a desirable location. FIG. 3B shows a cross section (303) of this Mach-Zehnder modulator (300) with two arms of different lengths.

Figure 9:
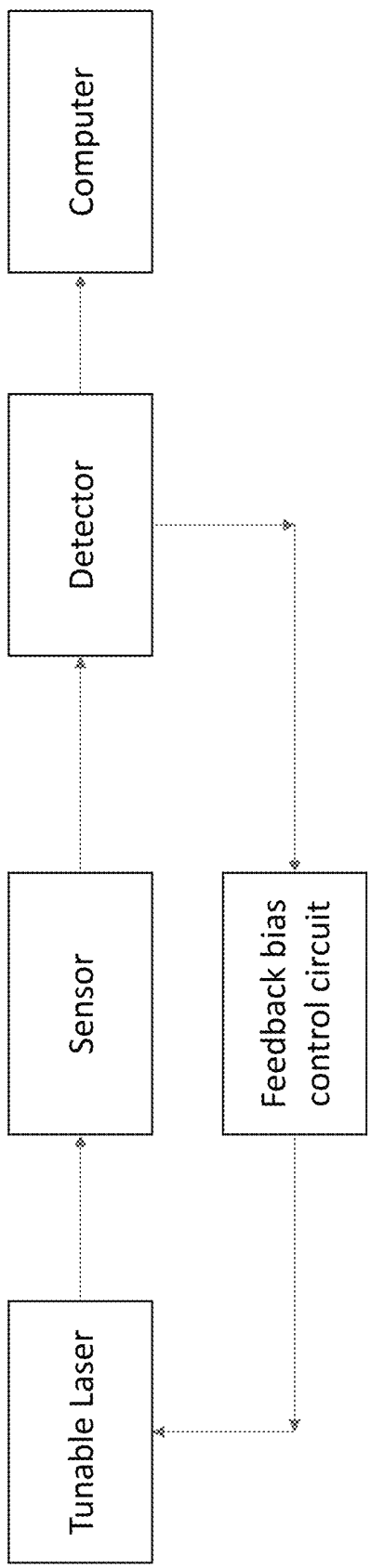
FIG. 9 shows a system block diagram for an e-field sensor utilized to control the bias point and the final detection scheme for detecting the modulated optical signal in the output of the device, in accordance with an embodiment of the invention.
Figure 10A:
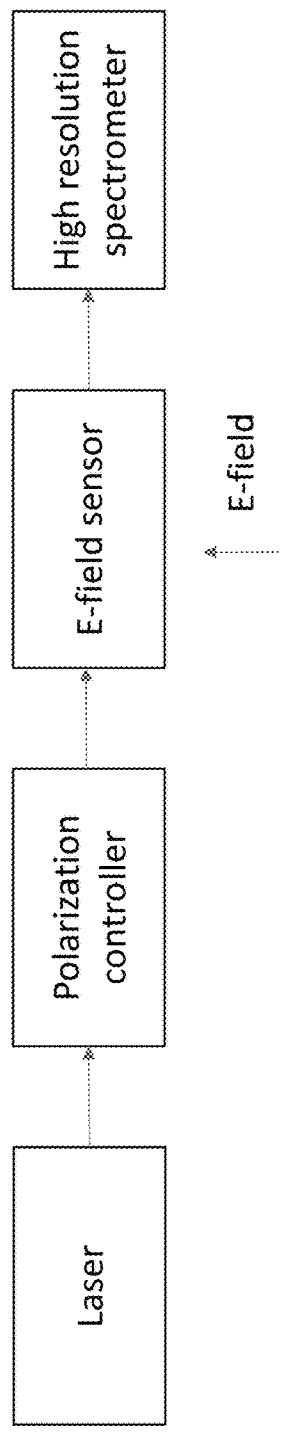
FIGS. 10A and 10B show optical interrogation systems that utilize a detector, a spectrum analyzer, or a FROG system for detection of the output of the novel electric field sensor designed in accordance with an embodiment of the invention.
Figure 10B:
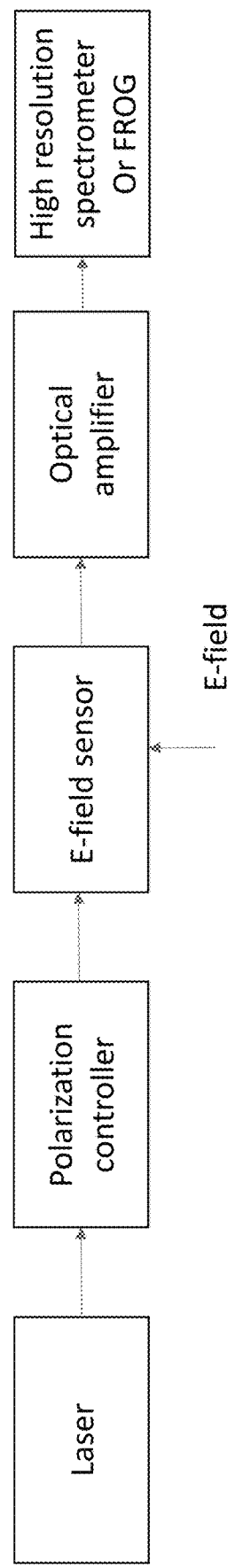
Figure 12:
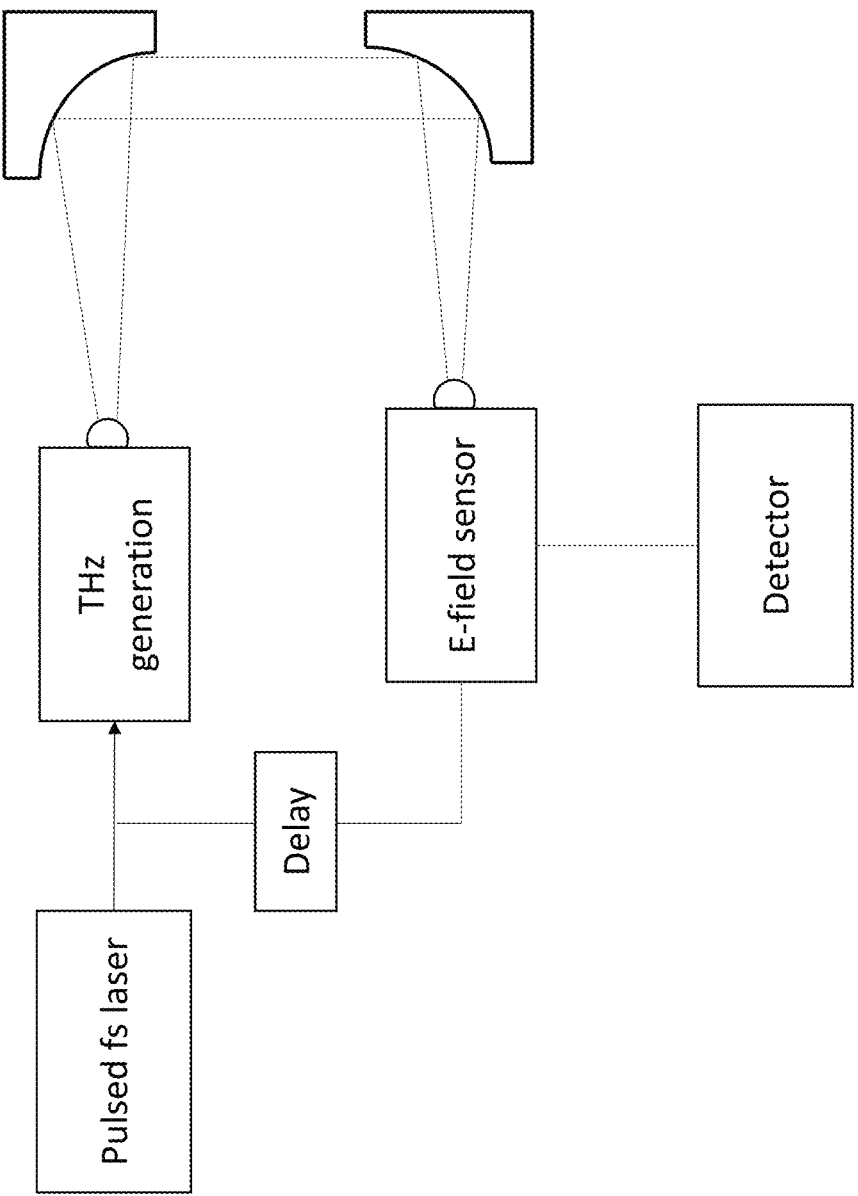
FIG. 12 shows an application example of the disclosed electric field sensor for sensing of THz signals electric files in a time domain THz spectroscopy system using femtosecond pulsed laser sources, in accordance with an embodiment of the invention.
Figure 13:
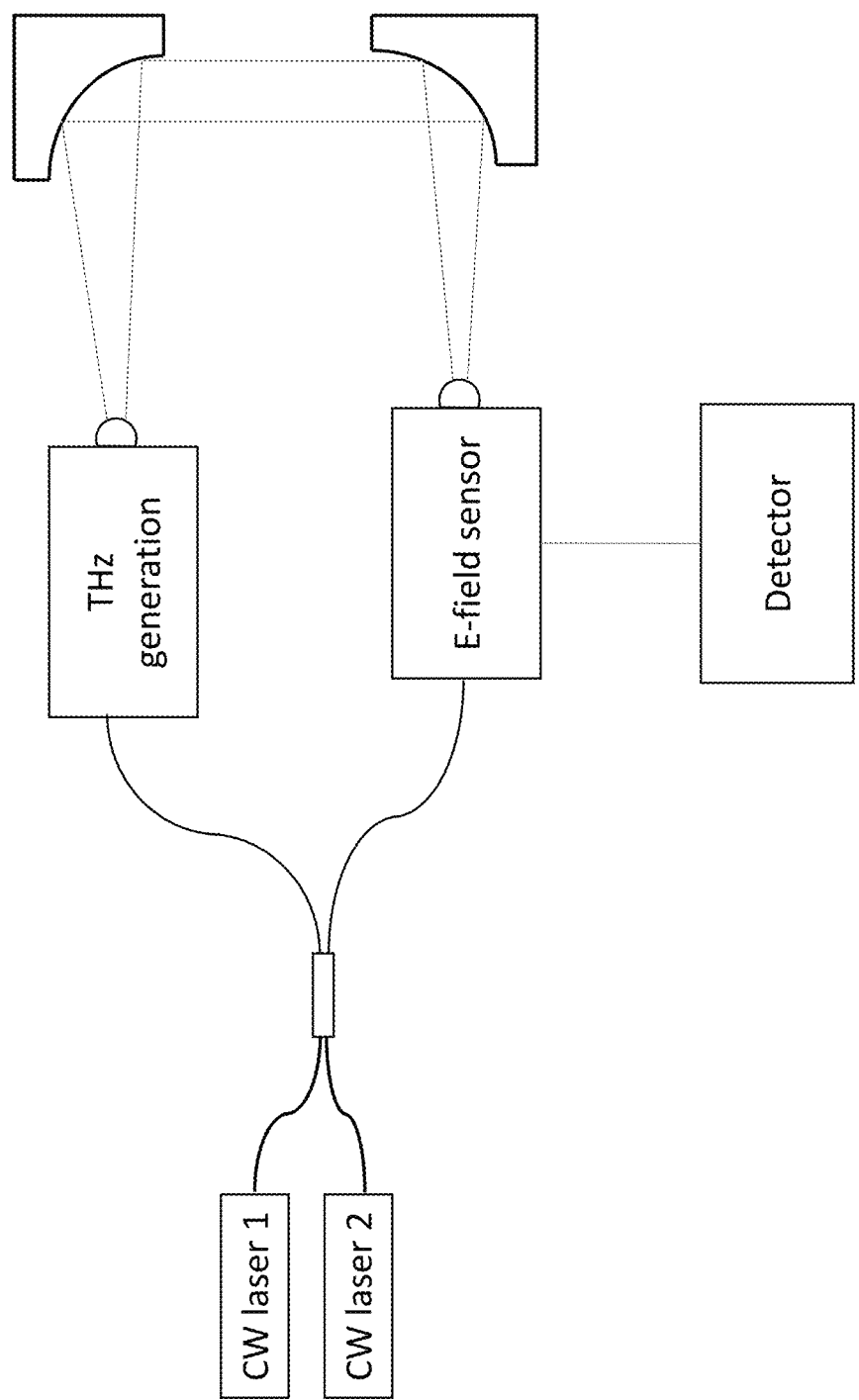
FIG. 13 shows an application example of a novel electric field sensor for sensing of CW THz signals electric field in a frequency domain THz spectroscopy system, in accordance with an embodiment of the invention.

Furthermore, FIG. 9 shows a system to control the bias point of the modulator by wavelength tuning, wherein a tunable laser is utilized and a detector measures the sensor output. The signal level is fed back (i.e. with a "feedback bias control circuit") to the tunable laser to tune its wavelength to keep the detector signal at a constant level for biasing at the desirable location. Alternatively, it is possible to use a sinusoidal dithered-tuned wavelength, similar to diether-tuning of bias of Mach-Zehnder modulators. The dithered wavelength creates a signal that can be used in a feedback loop to adjust the bias point of the sensor. As an illustrative example, FIGS. 10A and 10B show optical interrogation systems that utilize a detector, a spectrum analyzer, or a FROG system for detection of the output of the novel electric field sensor designed in accordance with an embodiment of the invention. The output-modulated optical signal of the disclosed sensor can be detected with a photo-detector, with a high-speed spectrometer or with a FROG (Frequency Resolved Optical Gating) detection technique depending on the application, as shown in FIGS. 10A and 10B. For detection of electric-field signals up to 40 GHz, it is possible to use an optical detector to detect the sensor output. For applications that need detection in THz range, an optical spectrometer or a FROG pulse characterization method may be utilized to detect the spectrum of the signal and apply Fourier transform to obtain time domain information of the modulating electric field. FIG. 12 shows a time domain THz spectroscopy system that can be used for this purpose. The output may also need to be amplified using an optical amplifier, such as EDFA or YDFA, before it is detected using the spectrometer or FROG technique, as shown in FIG. 10B. FIG. 13 shows an alternative THz spectroscopy system where two lasers are used with a frequency difference equal to the THz signal to be generated and detected using the proposed electric field sensor.

For some applications where a THz signal need to be detected using the novel e-field sensor, the THz e-field may be very weak and thus hard to detect. In such cases, the phase-modulated optical signal may not be able to detect the weak THz signal. A signal enhancement method may be needed to enhance the reception of the THz signal close to optical waveguides for better detection and signal to noise ratio. In order to enhance the THz signal in close proximity of the optical waveguides, an antenna may be used to enhance the input signal reception sensitivity. As an embodiment of the invention for this situation, FIG. 4A shows a sensor and FIG. 4B shows its cross section (400), where a dipole antenna (406) is utilized to measure the THz signal with an improved input signal reception sensitivity. The THz signal in this case is impinged perpendicular to the sensor surface and its polarization must be parallel to the dipole antenna (406). In this example, the antenna absorbs the THz signal and drives a coplanar transmission line circuit. The intensity of THz signal is significantly enhanced in close proximity of Mach-Zehnder modulator arms (402) in this case. Similar to other embodiments of the invention previously described, this device has grating couplers (407) to couple light to the chip, one or more waveguides (409) for the Mach-Zehnder modulator arms (402), and an MMI splitter/combiner section (403) for splitting and combining optical signal. In addition to control the bias of the modulator, additional electrode sections (404, 405, 408) are added to the device layout. A DC bias voltage is applied to these electrodes (404, 405, 408) to adjust the DC bias point of the device. Furthermore, in this example, MMI crossing sections (401) on the Mach-Zehnder modulator arms (402) are utilized to maximally preserve the symmetry of the device, as shown in FIG. 4B.

Figure 5B:
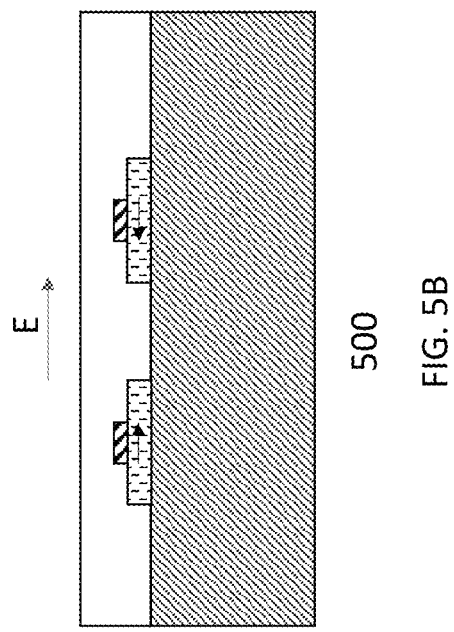
FIG. 5B shows a cross section of this optical circuit, in accordance with an embodiment of the invention
Figure 5A:
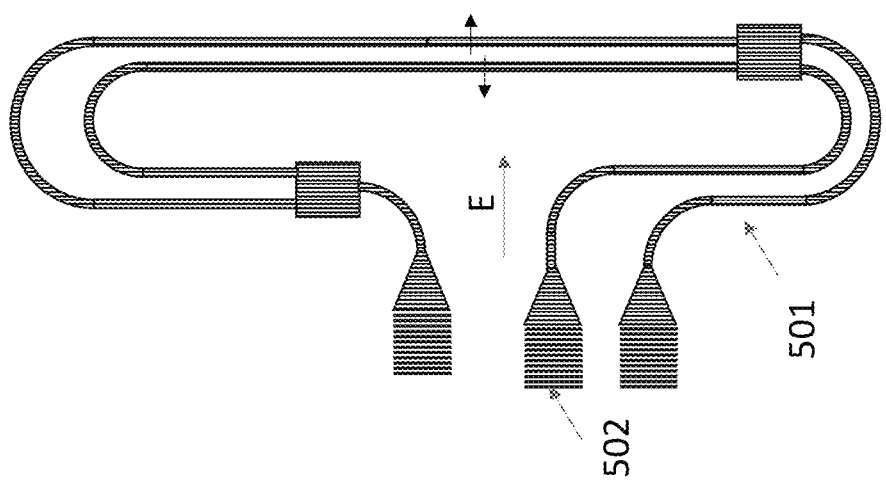
FIG. 5A shows an optical circuit of a Mach-Zehnder based electric-field sensor that incorporates optical waveguides, grating coupler sections, and an additional waveguide section in the length difference in the two arms of the interferometer for bias control and an additional output for balanced detection schemes while showing the direction of the spontaneous polarization of the electro-optic material.

FIG. 5A shows another variant of proposed sensor, and FIG. 5B shows its cross-sectional view (500), where two complimentary output ports (501, 502) are utilized to produce a modulated optical signal in one port that compliments in opposite to the second port. The complimentary output port configuration allows higher sensitivity and balanced detection schemes to achieve higher sensitivity.

Figure 6B:
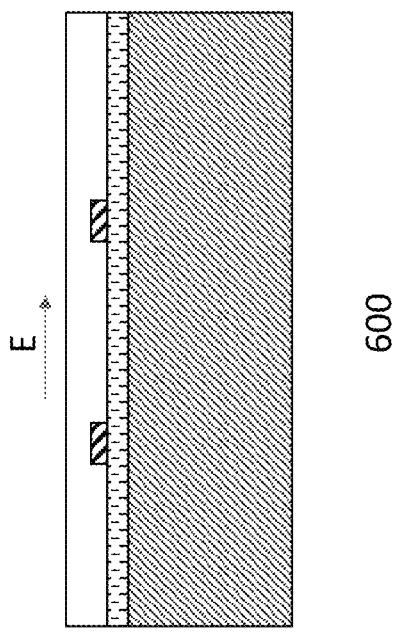
FIG. 6B shows a cross section of this optical circuit, in accordance with an embodiment of the invention
Figure 6A:
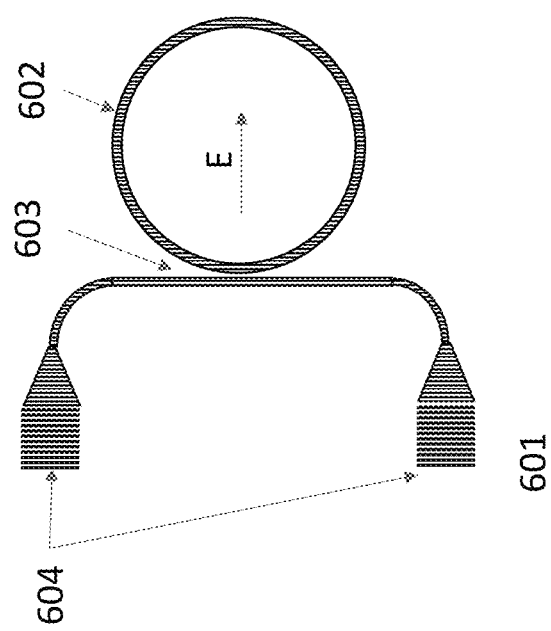
FIG. 6A shows an optical circuit of a Micro-ring modulator based electric-field sensor.

Furthermore, in another embodiment of the invention, FIG. 6A shows a novel optical circuit (601) for an electric field sensor based on micro-ring resonator, while FIG. 6B shows a cross section (600) of this novel optical circuit. This novel optical circuit is made on a lithium niobate thin film, which is bonded to a quartz substrate, similar to the electric field sensor based on Mach-Zehnder interferometer. This sensor has the advantage of being very compact and can be used for electric field sensing applications that need very high spatial resolution. The sensor comprises a micro-ring section (602), input and output grating couplers (604), and a coupler (603), where the energy is coupled from the straight waveguide to the ring resonator. The circuit is made similar to Mach-Zehnder modulator type sensor described above on a quartz substrate. When an electric field is applied parallel (i.e. for highest sensitivity) to the micro-ring's structure, and also parallel to the direction of spontaneous polarization of the electro-optic crystal, it can shift the resonance frequency of the resonator due to electro-optic effect. This shift in resonance wavelength causes a shift in the phase and the intensity of transmitted optical signal of the device. The modulated intensity or phase is detected and is proportional to the measured e-field signal. Because the micro resonator is a very compact device (e.g. typically in a dimensional range of 50-100 microns), it is possible to obtain a high-spatial resolution electro-optic sensor. It is also possible to either detect intensity or the modulated phase of optical signal passed in the ring resonator. Using the structure shown in FIG. 6A and FIG. 6B, it is possible to simply detect the intensity of transmitted signal to measure the electric field.

FIG. 7A shows a micro-ring sensor, and FIG. 7B shows its cross section (700), where an additional Mach-Zehnder optical circuit is used to detect the phase of modulated light passing a ring resonator (702). Unlike the previously-disclosed embodiment of the invention associated with FIGS. 6A-6B, in the structure as shown in FIGS. 7A-7B, the micro-ring mainly modulates the phase of transmitted light in one arm. The phase detecting section is similar to a Mach-Zehnder interferometer. It comprises two arms (704, 705) and power combiners and splitters (709, 710). The phase of one arm (704) is adjusted at the quadrature point with respect to second arm (705) by using slightly wider waveguide width. The micro-ring resonator (702) is biased at the resonance condition by adjusting laser wavelength and is critically coupled. The light is coupled using input grating coupler (706) and is detected using output grating couplers (707, 708). Two output can be used for balanced detection or simply one output can be used for normal detection methods.

Figure 8B:
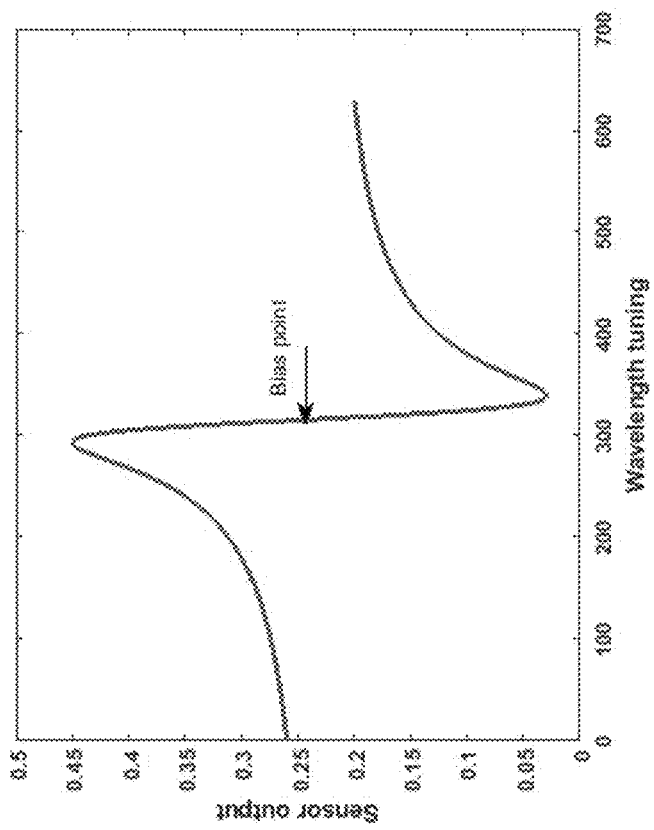
FIG. 8A and FIG. 8B show the transfer function of Mach-Zehnder modulator sensor and the Micro-ring sensor coupled to a Mach-Zehnder interferometer as well as the bias point where maximum sensitivity is achieved for detection of a weak electric field, in accordance with an embodiment of the invention.
Figure 8A:
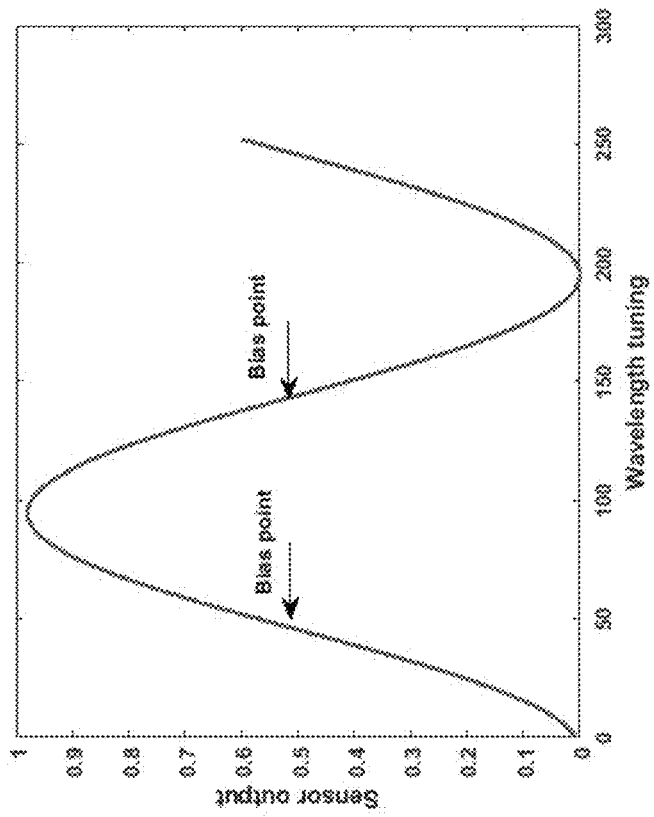

In the embodiment of the invention as shown in FIGS. 7A-7B, the ring resonator (702) is configured to operate at a critical coupling condition to achieve maximum sensitivity. As an illustrative example, FIG. 8A and FIG. 8B show the transfer function of Mach-Zehnder modulator sensor and the Micro-ring sensor coupled to a Mach-Zehnder interferometer as well as the bias point where maximum sensitivity is achieved for detection of a weak electric field, in accordance with an embodiment of the invention. When an electric field (703) is applied, the transmitted light phase coupled to the ring resonator (702) using the straight waveguide (i.e. one of the arms (705)) changes. This change in phase is proportional to the applied electric-field. The modulated phase is converted to an intensity signal after combining in the second power splitter (710). In the preferred embodiment of the invention, the arms of Mach-Zehnder structures are very short (e.g. in the range of 30 microns) and are not affected by the applied electric field (703) because they are oriented to be parallel to the electric field's direction and also parallel to the z-axis of the electro-optic crystal. Furthermore, in the preferred embodiment of the invention, the micro-ring section can be as small as 20 microns to several hundred microns in diameter. Therefore, a very high spatial-sensitivity sensor is achieved for electric field sensing. By using a phase detection scheme, instead of a direct intensity modulation scheme, a better sensitivity and a much better linearity can be achieved because the second harmonic modulation term is zero using this technique, with the result being similar to quadrature-biased Mach-Zehnder modulator structure.

Figure 11B:
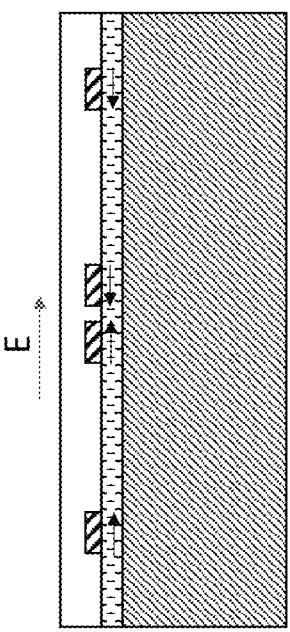
FIG. 11 shows a device structure and a corresponding cross section for a double micro-ring structure where a doublet resonance condition is achieved using two ring resonators for sensing of electric filed signals with higher frequency than a single micro-ring resonator bandwidth, in accordance with an embodiment of the invention.
Figure 11A:
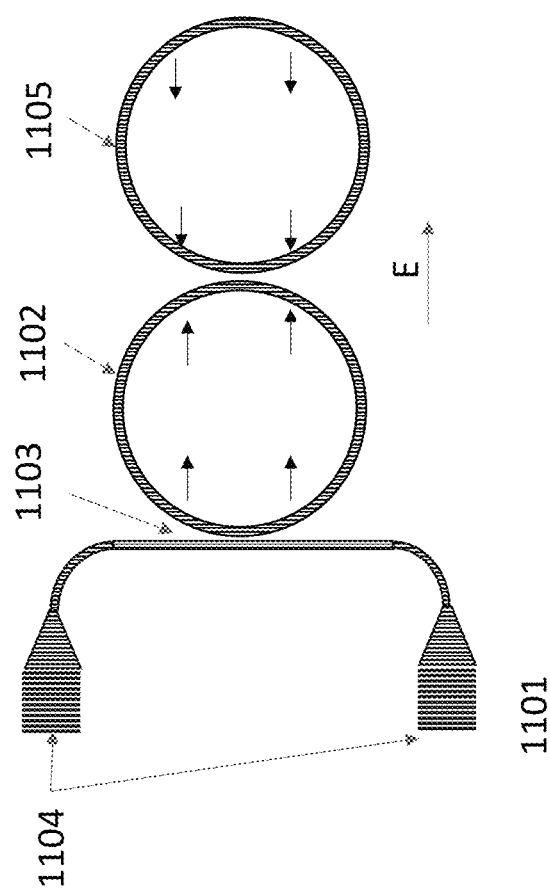

The electric field sensor that was disclosed can achieve high spatial resolution and high sensitivity. However, the sensor has a limited bandwidth. For a single ring resonator sensor, the resonance condition has a limited bandwidth typically between 10 MHz to 10 GHz. The sensors with higher bandwidth have lower sensitivity. If it is desirable to achieve high sensitivity for detecting electric field signals with high frequency (i.e. between 1 GHz to 100 GHz), a double micro-ring structure as shown in FIGS. 11A~11B can be used. In this structure, two micro-ring resonators are coupled together and one of the resonators is coupled to a bus waveguide. The resonators are poled in opposite direction. The combined transmission spectrum of this structure has two resonance frequencies. The difference in the optical resonance frequencies of these two resonators is controlled by coupling strength between the two optical resonators. This frequency difference should be selected to be equal to the modulating electric field signal frequency to be detected. (i.e. between 1 GHz to 100 GHz). The structure for this sensor is shown in FIG. 11A. The sensor comprises two grating couplers (1101, 1104) that couple light in and out of the device. The light is coupled to a first ring resonator (1102) via a first coupler (1103). The coupling strength is selected such that the highest signal modulation depth is achieved from best sensitivity. Typical coupling power values are between 0.1% to 20%. A second ring resonator (1105) has exactly same diameter as the first ring resonator (1102), and is coupled to the first ring resonator (1102) by a coupler. The strength of this coupler determines the splitting frequency between resonances and the coupling value may be between 0.1% to 30%. Since the second ring resonator (1105) is poled opposite to the first ring resonator (1102), when the sensor is placed in an electric field, one resonator resonance frequency increases while the other resonator frequency decreases. This causes coupling power between two resonance frequencies, resulting in a modulation of the optical signal. This sensor can achieve a high sensitivity (i.e. as large as 10 mV/m/Hz$^{0.5}$) for frequencies in the range of 1 GHz to 100 GHz.

Various embodiments of the present invention introduce one or more novel methods to produce an electro-optic sensor for detecting electric fields at RF and THz frequency range. In one embodiment of the invention, an optical waveguide Mach-Zehnder modulator is produced on a thin film of lithium niobate bonded on a quartz substrate. The arms of the sensor are polled in opposite directions to produce opposite change in refractive index when an electric field is applied to the device. The phase modulated light interferes and creates an optical intensity signal that can be detected using a high-speed detector or an optical spectrum analyzer or frequency resolved optical gating method, thus enabling a novel THz e-field detector. Alternatively, a micro-ring resonator bonded and fabricated on a quartz substrate can be used where the ring resonance shifts by the applied electric field, which in turn enables a high spatial resolution e-field sensor.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the claims that will be presented in a corresponding non-provisional application.

What is claimed is:

1. A method for producing an electro-optic electric field sensor, the method comprising the steps of:
   placing and bonding an electro-optic material layer on top of a low dielectric constant substrate;
   forming a thin film of the electro-optic material layer on top of the low dielectric constant substrate;
   depositing and patterning metallic electrode layers on the remaining electro-optic material and the low dielectric constant substrate to accommodate poling that alternates ferroelectric domains of the electro-optic electric field sensor whenever necessary for a Mach-Zehnder-type sensor structure;
   poling to reverse a direction of spontaneous polarization of the remaining electro-optic material in selected regions, whenever reversing the direction of spontaneous polarization in the selected regions is desired;

etching the metallic electrode layers to achieve a resulting structure with no metallic parts;

utilizing lithography and etching to define a ridge waveguide structure;

encapsulating the ridge waveguide structure in a top cladding layer; and aligning and attaching fiber optic cables to the ridge waveguide structure to constitute the electro-optic electric field sensor.

2. The method of claim 1, further comprising a step of performing an ion implantation on top of the low dielectric constant substrate prior to the step of placing and bonding an electro-optic material layer on top of the low dielectric constant substrate.

3. The method of claim 1, wherein the electro-optic material layer is made of lithium niobate or lithium tantalite, and the low dielectric constant substrate is made of glass, crystalline, or amorphous quartz.

4. The method of claim 1, wherein the electro-optic electric field sensor is a Mach-Zehnder modulator with a first arm poled opposite to a second arm.

5. The method of claim 1, wherein the electro-optic electric field sensor is a Mach-Zehnder modulator with a first arm poled opposite to a second arm, and wherein the first arm is longer than the second arm to control the bias point of the sensor by changing a laser wavelength.

6. The method of claim 1, wherein the electro-optic electric field sensor is a Mach-Zehnder modulator with a first arm poled opposite to a second arm, and wherein the metallic electrode layers are deposited to function as an antenna that enhances an input signal reception sensitivity of the electro-optic electric field sensor.

7. The method of claim 1, wherein the electro-optic electric field sensor is a micro-ring resonator coupled to a bus waveguide to form a high-sensitivity compact sensor.

8. The method of claim 1, wherein the electro-optic electric field sensor includes two coupled micro-ring resonators in which one ring is coupled to a bus waveguide to form a high-sensitivity high frequency sensor.

9. The method of claim 1, wherein the electro-optic electric field sensor is part of an electro-optic system comprising a laser, a detector, and a feedback loop to control a wavelength of a laser to achieve correct bias point for the sensor at a maximum sensitivity.

10. The method of claim 1, wherein the electro-optic electric field sensor is part of a time-domain THz spectroscopy system in which a THz signal is generated by a femtosecond laser and detected by the electro-optic electric field sensor.

11. The method of claim 1, wherein the electro-optic electric field sensor is part of a frequency domain THZ spectroscopy system in which a THZ signal is generated with two CW laser sources and detected by the electro-optic electric field sensor.

* * * * *